(12) United States Patent
Yamazaki

(10) Patent No.: US 7,588,947 B2
(45) Date of Patent: Sep. 15, 2009

(54) METHOD OF EVALUATING SEMICONDUCTOR DEVICE AND METHOD OF MANUFACTURING SEMICONDUCTOR DEVICE

(75) Inventor: Toru Yamazaki, Saga (JP)

(73) Assignee: Sumco Corporation, Tokyo (JP)

( * ) Notice: Subject to any disclaimer, the term of this patent is extended or adjusted under 35 U.S.C. 154(b) by 518 days.

(21) Appl. No.: 11/563,759

(22) Filed: Nov. 28, 2006

(65) Prior Publication Data

US 2007/0196936 A1    Aug. 23, 2007

(30) Foreign Application Priority Data

Nov. 29, 2005    (JP) .............................. 2005-343153

(51) Int. Cl.
    *G01R 31/26* (2006.01)
    *H01L 21/66* (2006.01)
(52) U.S. Cl. ................................. 438/14; 257/E21.521
(58) Field of Classification Search .................... 438/14, 438/18; 257/E21.521
    See application file for complete search history.

(56) References Cited

U.S. PATENT DOCUMENTS 5,779,925 A * 7/1998 Hashimoto et al. ............ 216/67
5,822,717 A * 10/1998 Tsiang et al. ............... 702/108

FOREIGN PATENT DOCUMENTS

JP        5-335396      12/1993
JP        2001-127126    5/2001

OTHER PUBLICATIONS

English Language Abstract of JP 2001-127126.
English Language Abstract of JP 5-335396.
Hori, "Gate Dielectrics and MOS ULSIs," Springer Series in Electronics and Photonics 34, Springer, p. 178.
"Semi M60-0305: Test Method for Time Dependent Dielectric Breakdown Characteristics of SiO2 Films for Si Wafer Evaluation," Semiconductor Equipment and Materials International (SEMI), 2005.

* cited by examiner

Primary Examiner—Brook Kebede
(74) Attorney, Agent, or Firm—Greenblum & Bernstein P.L.C.

(57) ABSTRACT

The method of evaluating a semiconductor device having plural semiconductor elements comprised of an insulating film and an electrode on a semiconductor substrate including, dividing the surface of the semiconductor substrate into plural measurement regions comprising plural semiconductor elements, and in each of the measurement regions, applying current to the semiconductor elements comprised in the measurement region to conduct detections of dielectric breakdown of the insulating film that occurs by the application of current, wherein the current application is conducted in such a manner that the level of current flowing through the measurement region is constant through the current application as well as identical in each of the measurement regions.

8 Claims, 6 Drawing Sheets

METHOD OF EVALUATING SEMICONDUCTOR DEVICE AND METHOD OF MANUFACTURING SEMICONDUCTOR DEVICE

CROSS-REFERENCE TO RELATED APPLICATIONS

This application claims benefit of priority under 35 USC 119 to Japanese Patent Application No. 2005-343153 filed on Nov. 29, 2005, which is expressly incorporated herein by reference in its entirety.

BACKGROUND OF THE INVENTION

1. Field of the Invention

The present invention relates to a method for evaluating a semiconductor device having semiconductor elements comprised of an insulating film and an electrode on a semiconductor substrate, in more detail, to a method for evaluating a semiconductor device, by which dielectric breakdown of the insulating film can be rapidly evaluated with high precision. In addition, the present invention relates to a method for manufacturing a semiconductor device using the above evaluation method.

2. Discussion of the Background

As LSIs with Metal-Insulator-Semiconductor (MIS) structures have undergone a high level of integration in recent years, the reliability required of the insulating film has increased. The Time Zero Dielectric Breakdown (TZDB) method, Time Dependence Dielectric Breakdown (TDDB) method, and the like have been widely employed as methods of evaluating the reliability of the insulating film. The TDDB method is also employed to evaluate the lifetime of insulating films.

A common method of evaluating the reliability of insulating (oxide) films will be described below.

An oxide film is grown on a semiconductor substrate. Polycrystal silicon doped with impurities or a metal film is deposited thereon, and photolithography and etching are used to form electrodes. By the above steps, multiple MIS capacitors are fabricated. These MIS capacitors can be employed to evaluate the lifetime of insulating films in the following manner. First, current is applied to each element and the voltage between the electrode and substrate of each element is monitored. Here, if dielectric breakdown of the oxide film occurs, the absolute value of the applied voltage decreases suddenly. Thus, the lifetime of the insulating film can be evaluated based on the decrease in voltage.

Since the above dielectric breakdown is a statistical phenomenon, multiple elements must be measured to obtain reliable data. Further, multiple elements on a wafer must be evaluated to evaluate the quality of a wafer as a whole. However, when evaluating the quality of multiple elements, the evaluation of elements one by one is impractical because a great deal of time is required for measurement. Accordingly, measurement has been proposed in which plural elements are simultaneously measured.

For example, Japanese Unexamined Patent Publication (KOKAI) No. 2001-127126 ("Reference 1" hereinafter), which is expressly incorporated herein by reference in its entirety, discloses the application of constant-voltage stress to multiple elements employing a single power source to simultaneously measure multiple elements at the wafer level in a constant-voltage stress TDDB test.

The simultaneous evaluation of multiple elements at the wafer level by a constant-current stress method in which a certain stress is applied to insulating films in a test has also been proposed. For example, Japanese Unexamined Patent Publication (KOKAI) Heisei No. 5-335396 ("Reference 2" hereinafter), which is expressly incorporated herein by reference in its entirety, discloses a method of employing a single power source and connecting elements in series. Further, T. Hori, Gate Dielectrics and MOS ULSI, Spriger, p. 178 ("Reference 3" hereinafter), which is expressly incorporated herein by reference in its entirely, discloses a method of preparing multiple probes and probing multiple sample elements at once using a device in which each probe is equipped with a power source and ammeter.

However, in the method described in Reference 1, the effects of charges trapped at boundary levels and the like cause the voltage stress applied to the insulating film to fluctuate, creating a problem in the form of poor reliability.

In the method described in Reference 2, since a voltage of 10 volts or greater must be applied to each element, a voltage of several hundred volts is required when only about 10 samples are connected, for example, and the application of stress for extended periods is undesirable from the perspective of environmental safety. Further, in this method, limitations on the power source make it difficult to increase the number of elements being measured.

In the method described in Reference 3, when the density of the current flowing through the entire measurement system increases, the drops in voltage, in particular, due to parasitic resistance of the wafer stage and wafer substrate cannot be ignored. Further, for large wafers of 300 mm or more in diameter, for example, it is geometrically difficult to simultaneously bring all the evaluation elements on the entire wafer surface into contact without multiple probe needles numbering in the several hundreds or several thousands touching each other, and thus difficult to probe the entire wafer surface. The stress to which the wafer is subjected by each probe is about 20 to 50 g. If 1,000 points are simultaneously probed, the wafer is subjected to a stress of 20 to 50 kg. Thus, the wafer and the measurement device may sometimes be negatively affected. When the total surface of the wafer is divided up and probed in multiple measurements, the number of elements evaluated during a single measurement is lower when probing the peripheral portion of the wafer than when probing near the center of the wafer, due to unformed tips and the like. Thus, a smaller current flows through the entire system when evaluating the peripheral portion of the wafer. Since the potential of the substrate varies based on the probing site due to this difference in current, the amount of drop in voltage when dielectric breakdown occurs varies over the surface of the wafer. Normally, the voltage is monitored and dielectric breakdown is detected when the change in voltage exceeds a certain level. Thus, when the level of change in voltage varies over the wafer surface, it becomes difficult to accurately detect dielectric breakdown.

SUMMARY OF THE INVENTION

A feature of the present invention provides for accurately and rapidly evaluating the reliability of an insulating film on a semiconductor substrate.

A feature of the present invention relates to a method of evaluating a semiconductor device having plural semiconductor elements comprised of an insulating film and an electrode on a semiconductor substrate including dividing the surface of the semiconductor substrate into plural measurement regions comprising plural semiconductor elements, and in each of the measurement regions, applying current to the semiconductor elements comprised in the measurement region to conduct detections of dielectric breakdown of the insulating film that occurs by the application of current, wherein said current application is conducted in such a manner that the level of current flowing through the measurement region is constant through the current application as well as identical in each of the measurement regions.

A feature of the present invention further relates to a method of manufacturing a semiconductor device including preparing a product lot of semiconductor devices having plural semiconductor elements comprised of an insulating film and an electrode on a semiconductor substrate, extracting at least one semiconductor device from the lot, evaluating the semiconductor device that has been extracted, and when the semiconductor device that has been extracted is determined as a nondefective product in said evaluation, supplying, as a finished product, a semiconductor device comprised in the lot from which the semiconductor device determined as a nondefective product has been extracted, wherein said evaluation of the extracted semiconductor device is conducted by the method of evaluating a semiconductor device of the present invention.

The present invention permits the rapid and accurate evaluation of plural semiconductor elements on a semiconductor substrate.

Other exemplary embodiments and advantages of the present invention may be ascertained by reviewing the present disclosure and the accompanying drawings.

BRIEF DESCRIPTION OF THE DRAWINGS

The present invention will be described in the following text by the exemplary, non-limiting embodiments shown in the figures, wherein.

DESCRIPTIONS OF THE EMBODIMENTS

Figure 1:
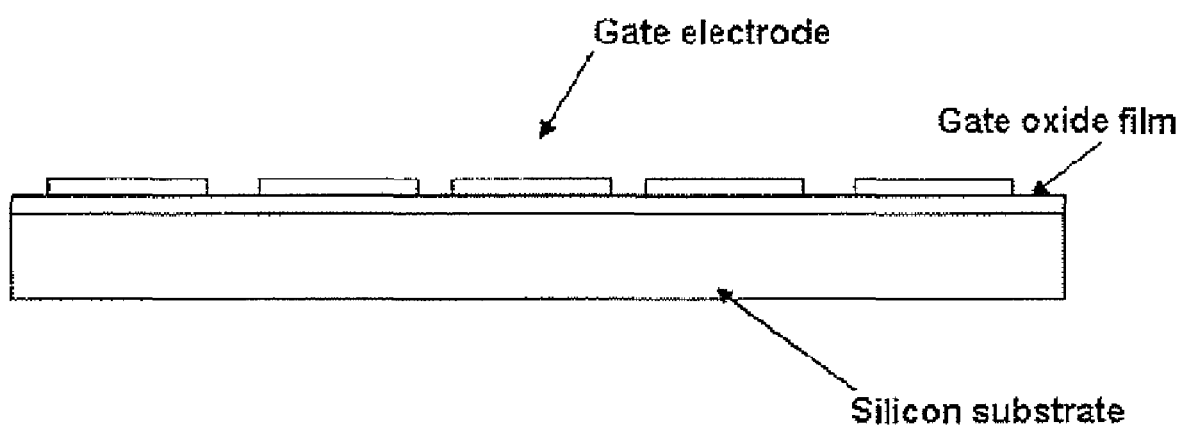
FIG. 1 is a schematic cross-sectional view of a semiconductor device.

The following preferred specific embodiments are, therefore, to be construed as merely illustrative, and not limitative of the remainder of the disclosure in any way whatsoever. In this regard, no attempt is made to show structural details of the present invention in more detail than is necessary for the fundamental understanding of the present invention, the description taken with the drawings making apparent to those skilled in the art how the several forms of the present invention may be embodied in practice.

The present invention relates to a method of evaluating a semiconductor device having plural semiconductor elements comprised of an insulating film and an electrode on a semiconductor substrate including dividing the surface of the semiconductor substrate into plural measurement regions comprising plural semiconductor elements, and in each of the measurement regions, applying current to the semiconductor elements comprised in the measurement region to conduct detections of dielectric breakdown of the insulating film that occurs by the application of current, wherein said current application is conducted in such a manner that the level of current flowing through the measurement region is constant through the current application as well as identical in each of the measurement regions.

In the present invention, the detection of the dielectric breakdown of the insulating films of plural semiconductor elements on a single substrate is conducted by dividing the surface of the semiconductor substrate into plural measurement regions comprising plural semiconductor elements and conducting detection in each of the plural measurement regions. Detecting the dielectric breakdown of the insulating films of plural elements simultaneously in this manner permits rapid evaluation.

Further, when detecting dielectric breakdown sequentially in plural measurement regions, the current application is conducted in such a manner that the level of current flowing through the measurement region is constant through the current application as well as identical in each of the measurement regions. That is, in the present invention, when simultaneously applying current stress to plural elements, current is continuously applied even to elements undergoing dielectric breakdown during the evaluation. Further, even when the number of elements contained in the measurement regions varies, the current is applied so that the level of the current flowing into each region is identical.

When the application of current stress to elements in which dielectric breakdown has occurred is sequentially halted immediately after the occurrence of dielectric breakdown, the level of the current flowing to the entire measurement system differs before and after dielectric breakdown. This change in current level in the entire system causes fluctuation in the level of voltage that is measured as the difference in potential between element electrode and the substrate through parasitic resistance. Further, since parasitic resistance itself is not a constant with respect to the current level, the amount of change in voltage before and after dielectric breakdown depends more on the current level applied to the entire system than when evaluating elements one by one. Thus, when the level of current flowing through the entire system increases, the drop in current when dielectric breakdown occurs is not clearly observed, making it difficult to determine that dielectric breakdown has occurred.

Further, when evaluating elements over the entire surface of the substrate to determine the distribution of defective elements on the substrate, although all elements can be probed by the needles of the probe card in the center of the substrate, the number of elements that can be probed at once is smaller at the perimeter of the substrate than in the center portion due to unformed elements and the like. In such a case, rendering the current flowing to each element constant causes the level of the drop in voltage when dielectric breakdown occurs to vary in-plane because the level of current flowing through the entire system varies from portion to portion. As set forth above, the voltage is normally monitored and dielectric breakdown is detected by a change of equal to or greater than a certain level in the voltage. Thus, when the level of the drop in voltage varies in-plane, it becomes difficult to accurately detect dielectric breakdown.

By contrast, in the present invention, current is applied in such a manner that the level of current flowing through the measurement region is constant through the current application as well as identical in each of the measurement regions. Thus, it becomes possible to accurately detect dielectric breakdown of the insulating film without the above-described problem.

The above-described semiconductor device comprises plural semiconductor elements comprised of an insulating film and an electrode an a semiconductor substrate. For example, the semiconductor substrate can be a silicon wafer and the insulating film can be an oxide film. The electrode can be formed by forming polycrystal silicon or a metal film on an insulating film on a semiconductor substrate and then conducting photolithography and etching. FIG. 1 shows a schematic cross-sectional view of such a semiconductor device. Specifically, this semiconductor device can comprise plural MIS capacitors on a silicon wafer. The thickness of the insulating film and electrode is not specifically limited and may be suitably set.

In the present invention, the semiconductor device is evaluated by detecting the dielectric breakdown of the insulating film occurred by the application of the current to the semiconductor element. When the flow of current to the semiconductor element is continued and the change in the level of voltage over time is monitored, a sharp drop in the level of voltage is observed at some stage. This indicates that the insulating film has undergone dielectric breakdown (the insulating film has broken down and become conductive). The longer the period before dielectric breakdown occurs, the greater the durability of the insulating film and the better the reliability, that is, the greater the durability and reliability of the semiconductor device.

Detection of dielectric breakdown is conducted by dividing the surface of the semiconductor substrate into plural regions each containing plural semiconductor elements and conducting detection in each of these plural regions. In each region, current is applied so that the level of current flowing through the measurement region is constant through the current application as well as identical in each of the measurement regions, and dielectric breakdown is detected in each element. In the present invention, the phrase, "the level of current flowing through the measurement region is constant through the current application as well as identical in each of the measurement regions" means that the level is constant and identical irrespective of the number of elements contained in each region and irrespective of whether or not dielectric breakdown has occurred in an individual element after the start of the application of current.

In the present invention, in the course of detecting dielectric breakdown, in order to keep the level of current flowing into the measurement regions constant and identical as mentioned above, the following means can be used.

(1) Normally, when evaluating elements one by one, the application of current to an element is halted at the point in time where dielectric breakdown occurs (for example, see: SEMI M60: Test Method for Time Dependent Dielectric Breakdown Characteristics of $SiO_2$ Films for Si Wafer Evaluation). However, when evaluating multiple elements, the flow of current is continued to elements in the measurement region even after they have undergone dielectric breakdown. When the application of current to elements that have undergone dielectric breakdown is halted, elements in which dielectric breakdown has not occurred are affected by the change in current through parasitic resistance, causing fluctuation in the level of voltage, that is measured as the difference in potential between the electrode of the element and the substrate when dielectric breakdown occurs. Accordingly, current continues to be applied to elements that have undergone dielectric breakdown, thereby preventing fluctuation due to parasitic resistance in the level of voltage measured as the difference in potential between the electrode of the element and the substrate. Further, since plural elements are measured, the level of current flowing in the entire system is greater than when evaluating elements one by one. When measuring plural elements, the ratio of the amount of change in voltage before and after dielectric breakdown to the level of the voltage itself becomes small due to nonlinearity of voltage and current characteristics. Thus, it is sometimes difficult to clearly observe the drop in voltage when dielectric breakdown occurs in comparison to the case when the measurement of elements is conducted one by one. When the application of current to samples in which dielectric breakdown has occurred is halted immediately after the occurrence of dielectric breakdown during the measurement as mentioned above, the current flowing through the entire measurement system is reduced by the amount. Through parasitic resistance, this change in current causes a change in substrate potential. The determination of dielectric breakdown occurred by the current application becomes difficult due to such a change in substrate potential and the like combined with the reduction in the ratio of the amount of change in voltage before and after dielectric breakdown to the level of the voltage itself as mentioned above. Accordingly, when evaluating multiple elements, continuing the flow of current to elements within the measurement region that have undergone dielectric breakdown makes it possible to prevent change in substrate potential due to parasitic resistance caused by halting the application of current, thereby permitting accurate detection of dielectric breakdown.

(2) When the same number of elements is being measured in each of the measurement regions, an identical current is supplied to each element. Further, when different numbers of elements are being measured in different measurement regions, the current that is applied to each element is adjusted so that the same current is supplied to each region as a whole. In this manner, the same level of current can be supplied to each region as a whole.

(3) For example, since the number of elements that can be probed may differ in the perimeter and center portions of a wafer, as set forth above, the number of elements being measured that is contained in each measurement region may differ. Thus, when the number of elements being measured within individual regions differs and the same current is supplied to each element, the level of current flowing through the entire system ends up differing. In such cases, one or more semiconductor elements comprised in regions in which detection of dielectric breakdown has already been conducted can be comprised in measurement regions in which fewer elements being measured are located. By comprising elements in which dielectric breakdown has already been detected (dielectrically broken down elements), the current flowing to dielectrically broken down elements can be adjusted while supplying the same current to the elements being tested to detect dielectric breakdown under identical conditions and supplying the identical level of current to each measurement region.

In the present invention, the number of elements being measured and the number of dielectrically broken down elements comprised in a measurement region can be suitably determined based on the size and total number of elements on the substrate. Since plural elements can be rapidly and accurately evaluated, the above evaluation method is particularly suited to the evaluation of large-diameter wafers containing large numbers of in-plane elements (e.g., equal to or more than 700 elements). Further, the current supplied to each element being measured and the total level of current flowing to an individual measurement region can be suitably set based on the desired level of quality or the like. Current can be applied by connecting each of elements in parallel.

The present invention further relates to a method of manufacturing a semiconductor device including preparing a product lot of semiconductor devices having plural semiconductor elements comprised of an insulating film and an electrode on a semiconductor substrate, extracting at least one semiconductor device from the lot, evaluating the semiconductor device that has been extracted, and when the semiconductor device that has been extracted is determined as a nondefective product in said evaluation, supplying, as a finished product, a semiconductor device comprised in the lot from which the semiconductor device determined as a nondefective product has been extracted, wherein said evaluation of the extracted semiconductor device is conducted by the method of evaluating a semiconductor device of the present invention.

As set forth above, dielectric breakdown of the insulating film can be rapidly and accurately detected in plural elements by the method of evaluating a semiconductor device of the present invention. Thus, semiconductor devices in the same lot as a semiconductor device that has been determined as a nondefective product in the above evaluation method can be supplied as a finished product, thereby making it possible to provide high-quality finished product devices with high reliability. The criteria used to determine a nondefective product can be set in consideration of the physical properties (dielectric breakdown time and the like) required by the application or the like of the semiconductor device.

EXAMPLES

The present invention will be described in detail below based on examples. However, the present invention is not limited to the examples.

Example

Process 1

Manufacture of a Semiconductor Device

A p-type (boron-doped) silicon wafer approximately 150 mm in diameter was RCA cleaned, after which a thermal oxide film (about 100 Angstroms in thickness) was formed at an oxidation temperature of approximately 850 degree Celsius. Polycrystalline Si was deposited thereover by CVD method to approximately 5,000 Angstroms and phosphorus doping was conducted. Photolithography was then employed to fabricate a resist pattern on the polycrystalline Si, dry etching was employed to pattern the polycrystalline Si, and the resist was removed. Subsequently, the oxide film on the reverse surface was removed. A semiconductor device having 144 semiconductor in-plane elements was thus obtained.

Process 2

Detection of Dielectric Breakdown

Figure 2:
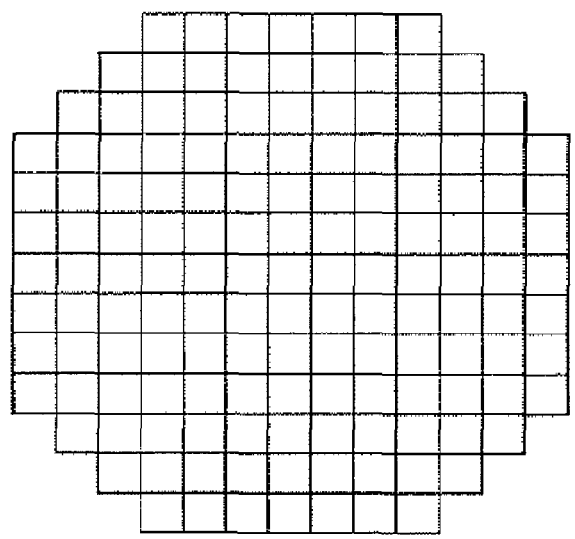
FIG. 2 is a drawing descriptive of the measurement region in Example.
Figure 2:
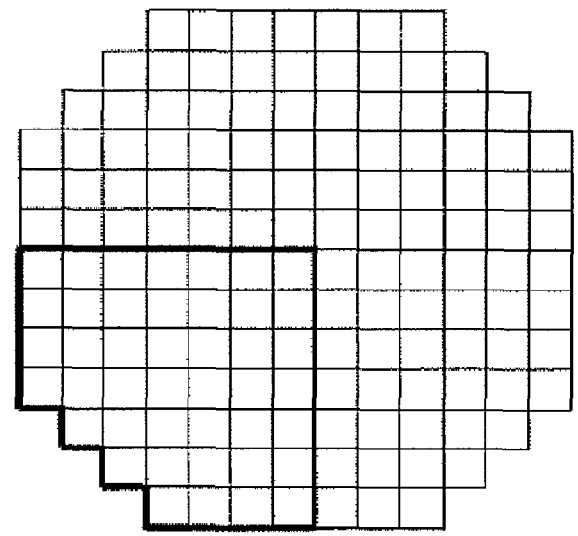
Figure 2:
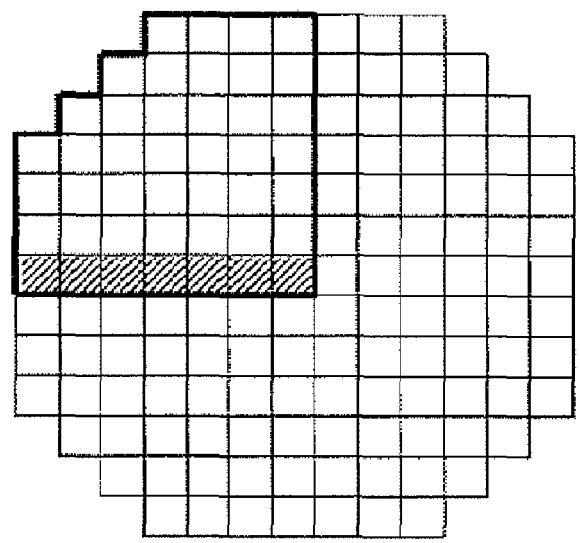
Figure 2:
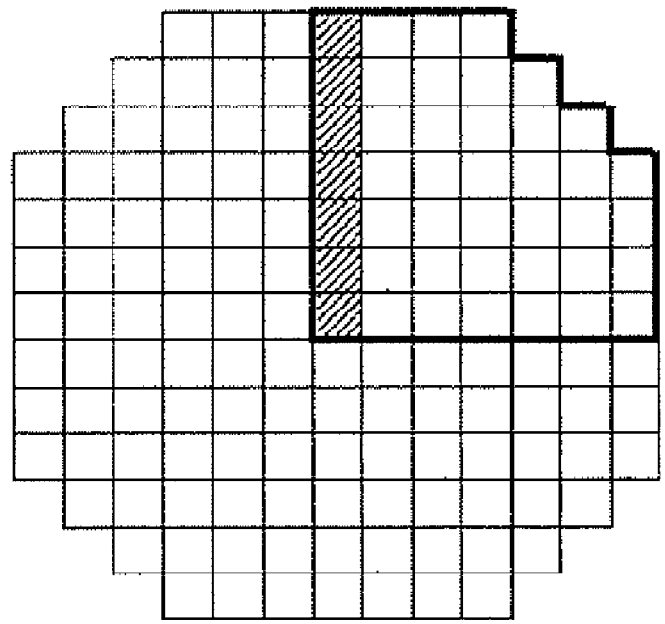
Figure 2:
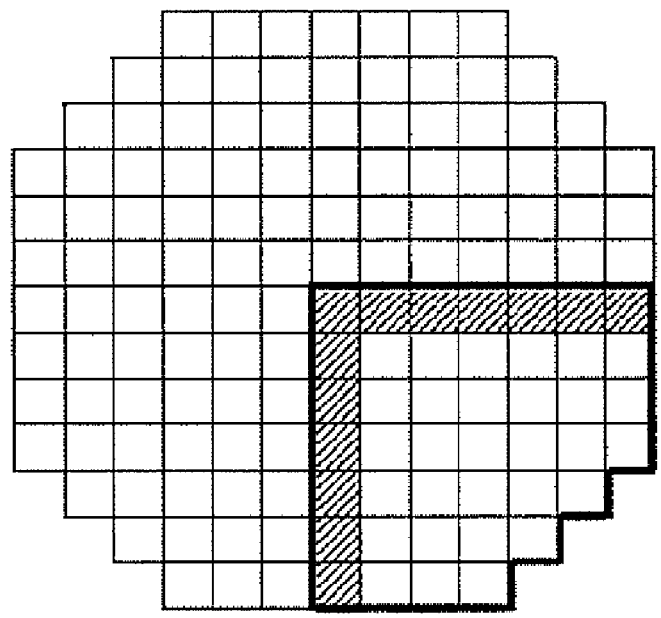

FIG. 2(a) shows the arrangement of semiconductor elements on the semiconductor device obtained in Process 1. In FIG. 2(a), each cell corresponds to an element. A probe card with pins arranged seven horizontally by seven vertically was employed during measurement. In this semiconductor device, in the region enclosed by the bold line in FIG. 2(b), approximately 1 mA current was applied to each element and dielectric breakdown was detected. Since there were 43 elements in this region, the total current flowing to the region was approximately 43 mA.

Next, dielectric breakdown detection was conducted in the region indicated by the bold line in FIG. 2(c). In FIG. 2(c), the cells indicated by hatching inside the bold line were elements for which detection of dielectric breakdown had already been conducted, that is, dielectrically broken down elements. Within each of the regions enclosed by bold lines in FIG. 2(c), approximately 1 mA current was applied to the elements denoted by outline cells, the level of current applied to individual dielectrically broken down elements was adjusted to approximately 1 mA per element, for example, and dielectric breakdown was detected at a total current of approximately 43 mA flowing into the measurement region.

Dielectric breakdown detection was identically conducted in the region denoted by the bold line in FIG. 2(d). In FIG. 2(d), cells indicated by hatching inside the bold line were elements for which detection of dielectric breakdown had already been conducted, that is, dielectrically broken down elements. Within each of the regions enclosed by bold lines in FIG. 2(d), approximately 1 mA current was applied to the elements denoted by outline cells, the level of current applied to individual dielectrically broken down elements was adjusted to approximately 1 mA per element, for example, and dielectric breakdown was detected at a total current of approximately 43 mA flowing into the measurement region.

Dielectric breakdown detection was identically conducted in the region denoted by the bold line in FIG. 2(e). In FIG. 2(e), cells indicated by hatching inside the bold line were elements for which detection of dielectric breakdown had already been conducted, that is, dielectrically broken down elements. Within each of the regions enclosed by bold lines in FIG. 2(e), approximately 1 mA current was applied to the elements denoted by outline cells, the level of current applied to individual dielectrically broken down elements was adjusted to approximately 1 mA per element, for example, and dielectric breakdown was detected at a total current of approximately 43 mA flowing into the measurement region.

Figure 3:
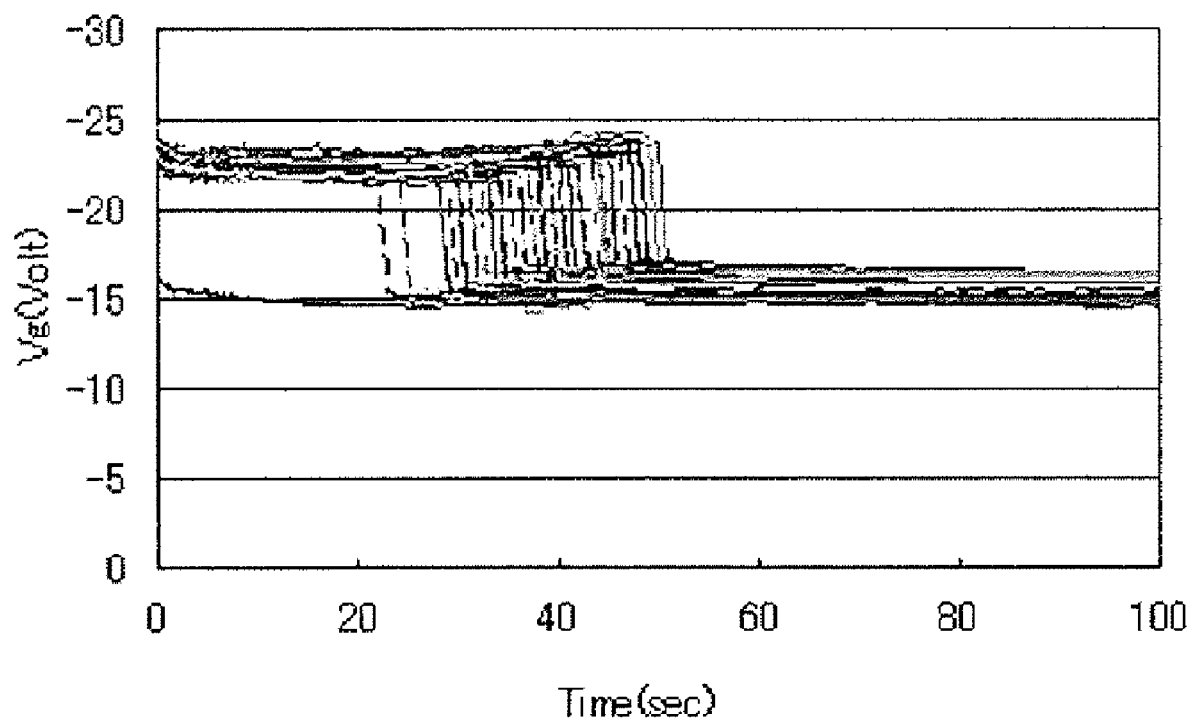
FIG. 3 shows change in the voltage level over time achieved in Example.

FIG. 3 shows change in the voltage level over time.

Comparative Example 1

Figure 4:
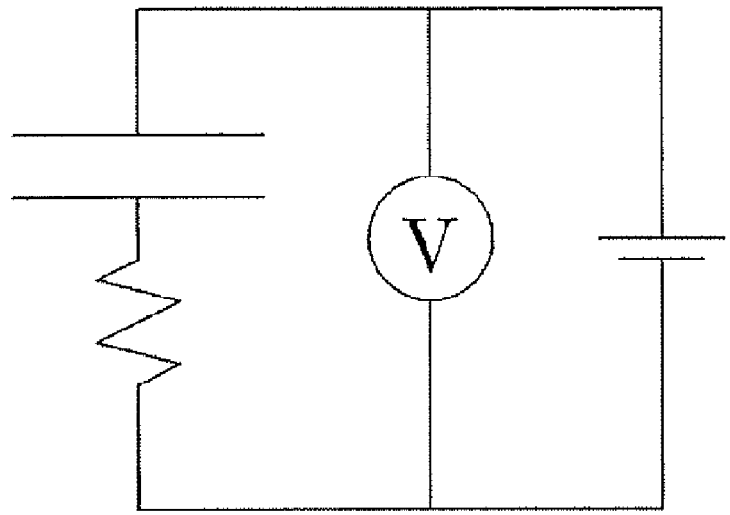
FIG. 4 is a drawing descriptive of the application of current in Comparative Example 1.
Figure 5:
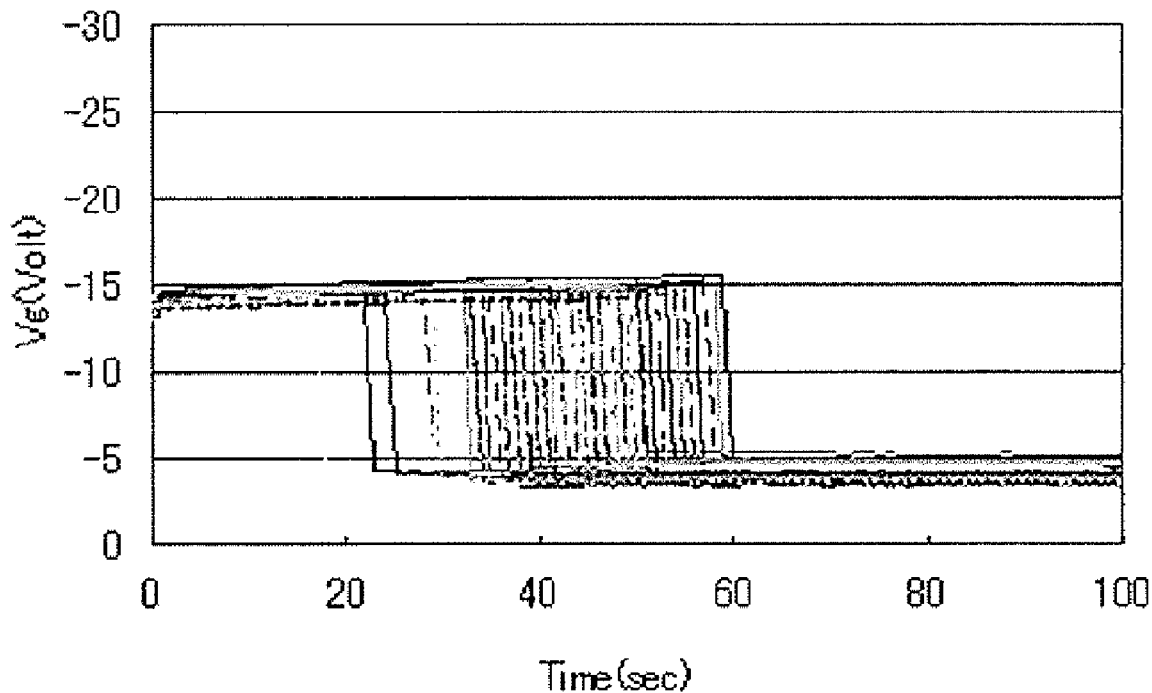
FIG. 5 shows the change in voltage level over time in Comparative Example 1.

A current stress of approximately 1 mA per element was sequentially applied as shown in FIG. 4 to each of the in-plane elements in the semiconductor device obtained in Process 1 and dielectric breakdown was detected. FIG. 5 shows the change in voltage level over time.

Comparative Example 2

Figure 6:
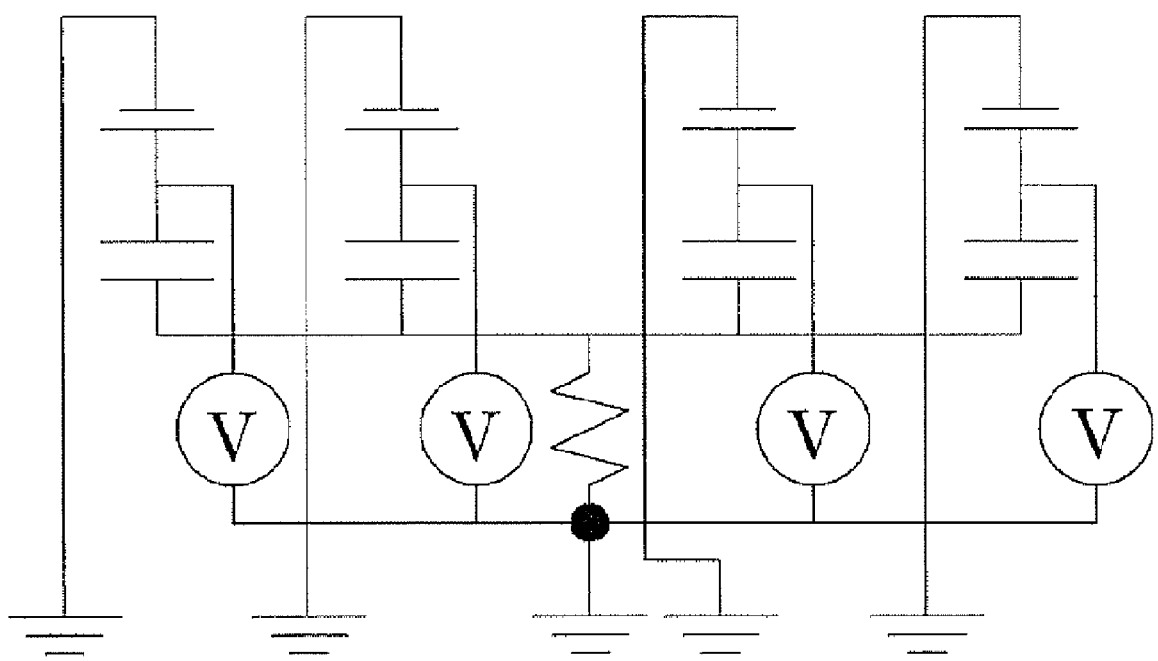
FIG. 6 is a drawing descriptive of the application of current in Comparative Example 2.
Figure 7:
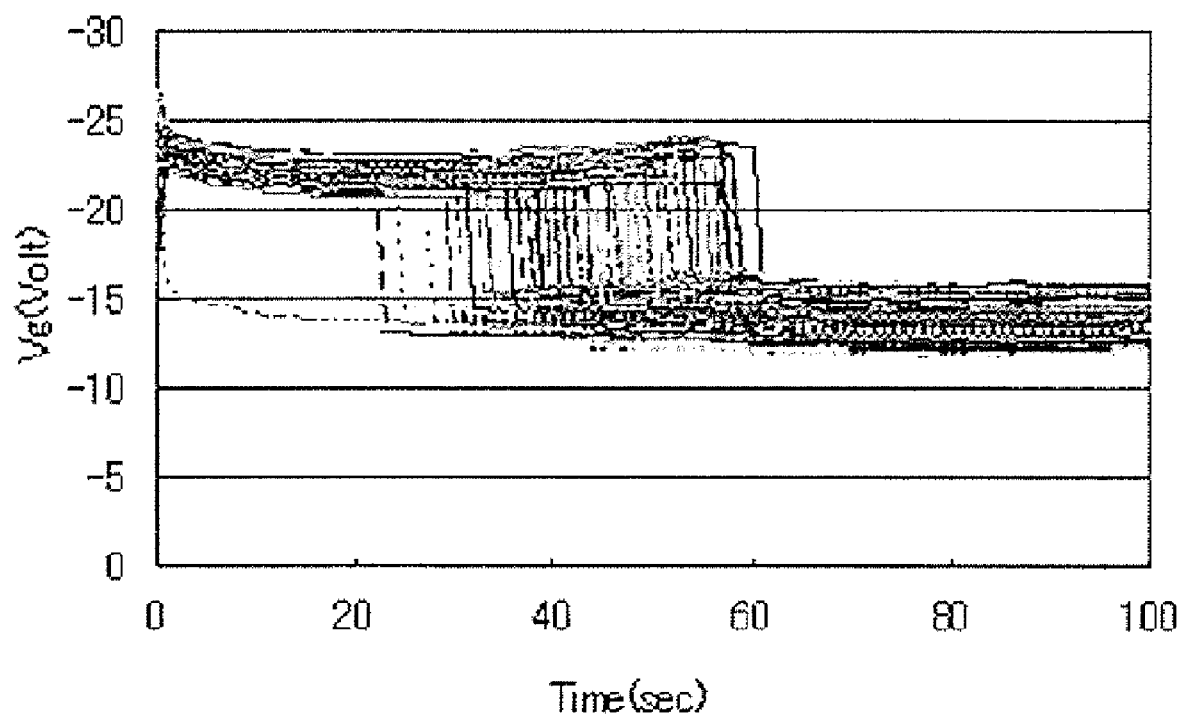
FIG. 7 shows the change in voltage level over time in Comparative Example 2.

A current stress of approximately 1 mA was applied as shown in FIG. 6 to each element in the semiconductor device obtained in Process 1 and dielectric breakdown was simultaneously detected for each in-plane element. However, the dielectric breakdown detection differed from that in Example in that current was not resupplied to samples once they underwent dielectric breakdown. FIG. 7 shows the change in voltage level over time in Comparative Example 2.

In FIGS. 3 and 5, the time at which sharp change in voltage occurs over time represents dielectric breakdown time. The potential in FIG. 5 is higher than that in FIG. 3. This is because when all in-plane elements were simultaneously evaluated, the level of current flowing in the entire system was greater than when evaluation was conducted element by element, and thus the potential of the substrate increased because of a rise in voltage due to parasitic resistance.

The voltage following dielectric breakdown of the oxide film in FIG. 7 varies greater than in FIG. 5. Therefore, in the case of FIG. 7, incorrect determinations might be curried out depending on the determination conditions, thickness of the oxide film, the number of elements measured at once, and the like.

By contrast, in FIG. 3, the voltage itself is higher than in FIGS. 5 and 7, but although the variation in voltage between elements is somewhat larger than in element-by-element measurement, it is lower than in FIG. 7 and accurate detection of dielectric breakdown is possible.

From the above results, it reveals that the present invention permits the detection of dielectric breakdown in plural elements at a sensitivity being as good as that in element-by-element measurement.

According to the present invention, dielectric breakdown of insulating films can be detected rapidly and accurately in LSIs with MIS configuration.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of evaluating a semiconductor device having plural semiconductor elements comprised of an insulating film and an electrode on a semiconductor substrate comprising:

dividing the surface of the semiconductor substrate into plural measurement regions comprising plural semiconductor elements; and in each of the measurement regions, applying current to the semiconductor elements comprised in the measurement region to conduct detections of dielectric breakdown of the insulating film that occurs by the application of current, wherein said current application is conducted in such a manner that the level of current flowing through the measurement region is constant through the current application as well as identical in each of the measurement regions.

2. The method of claim 1, wherein at least one of the detections is conducted in a measurement region comprising a semiconductor element which has been comprised in a measurement region of which dielectric breakdown has been already detected.

3. The method of claim 2, wherein an insulating film comprised in the semiconductor element which has been comprised in the measurement region of which dielectric breakdown has been detected is dielectrically broken down.

4. The method of claim 1, wherein the insulating film is an oxide film.

5. The method of claim 1, wherein the semiconductor substrate is a silicon wafer.

6. The method of claim 1, wherein the electrode is comprised of polycrystal silicon or metal.

7. The method of claim 1, wherein the semiconductor device is one comprising plural MIS capacitors on a silicon wafer.

8. A method of manufacturing a semiconductor device comprising:

preparing a product lot of semiconductor devices having plural semiconductor elements comprised of an insulating film and an electrode on a semiconductor substrate;

extracting at least one semiconductor device from the lot;

evaluating the semiconductor device that has been extracted; and when the semiconductor device that has been extracted is determined as a nondefective product in said evaluation, supplying as a finished product, a semiconductor device comprised in the lot from which the semiconductor device determined as a nondefective product has been extracted, wherein said evaluation of the extracted semiconductor device is conducted by the method of claim 1.

* * * * *